United States Patent
Sakuma et al.

(10) Patent No.: US 8,097,501 B2
(45) Date of Patent: Jan. 17, 2012

(54) METHOD FOR MANUFACTURING SEMICONDUCTOR DEVICE

(75) Inventors: Tomoyuki Sakuma, Hyogo-ken (JP); Shingo Sato, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/691,542

(22) Filed: Jan. 21, 2010

(65) Prior Publication Data
US 2010/0197088 A1  Aug. 5, 2010

(30) Foreign Application Priority Data
Feb. 5, 2009 (JP) ................. 2009-025192

(51) Int. Cl.
*H01L 21/336* (2006.01)
(52) U.S. Cl. .. 438/198; 438/269; 438/272; 257/E21.409
(58) Field of Classification Search .............. 438/198, 438/269, 272
See application file for complete search history.

(56) References Cited

U.S. PATENT DOCUMENTS

| | | | | |
|---|---|---|---|---|
| 2007/0148931 A1* | 6/2007 | Tokano et al. | ............... | 438/561 |
| 2008/0102582 A1* | 5/2008 | Takei | ............... | 438/270 |
| 2008/0166855 A1* | 7/2008 | Hshieh et al. | ............... | 438/427 |
| 2009/0085149 A1* | 4/2009 | Ishida et al. | ............... | 257/499 |
| 2009/0206398 A1* | 8/2009 | Yoshikawa et al. | ............ | 257/330 |
| 2009/0215239 A1* | 8/2009 | Nakazawa et al. | ............ | 438/270 |
| 2010/0044792 A1* | 2/2010 | Hebert | ............... | 257/341 |
| 2010/0059818 A1* | 3/2010 | Sasaki | ............... | 257/339 |
| 2010/0155831 A1* | 6/2010 | Parthasarathy et al. | ........ | 257/329 |
| 2010/0276750 A1* | 11/2010 | Tu | ............... | 257/330 |

FOREIGN PATENT DOCUMENTS

| | | |
|---|---|---|
| JP | 6-97085 A | 4/1994 |
| JP | 9-266311 A | 10/1997 |
| JP | 2006-114866 A | 4/2006 |

\* cited by examiner

*Primary Examiner* — Alexander Ghyka
(74) *Attorney, Agent, or Firm* — Patterson & Sheridan, LLP

(57) ABSTRACT

A method for manufacturing a semiconductor device, includes: forming a first-conductivity-type semiconductor region on a semiconductor layer; forming a mask member on the first-conductivity-type semiconductor region; selectively forming an opening in the mask member; etching the first-conductivity-type semiconductor region exposed to the opening to form a trench having a larger diameter than the opening and an eaves-like mask projected above the trench and made of the mask member; and forming a second-conductivity-type semiconductor region in the trench below the eaves-like mask by epitaxial growth to form a structure section in which the first-conductivity-type semiconductor region and the second-conductivity-type semiconductor region are alternately repeated in a direction generally parallel to a major surface of the semiconductor layer.

14 Claims, 5 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-25192, filed on Feb. 5, 2009; the entire contents of which are incorporated herein by reference.

BACKGROUND OF THE INVENTION

1. Field of the Invention

This invention relates to a method for manufacturing a semiconductor device.

2. Background Art

The on-resistance of a vertical power MOSFET (metal oxide semiconductor field effect transistor) greatly depends on the electric resistance of its conduction layer (drift layer) portion. The dopant concentration determining the electric resistance of the drift layer cannot exceed a maximum limit, which depends on the breakdown voltage of the pn junction interface between the base layer and the drift layer.

Thus, there is a tradeoff between the device breakdown voltage and the on-resistance. Improving this tradeoff is important in reducing the power consumption of a power device. This tradeoff has a limit determined by the device material. Overcoming this limit is the way to realizing devices with low on-resistance beyond existing power semiconductor devices.

As an example MOSFET to solve this problem, a structure with p-type pillar layers and n-type pillar layers alternately arranged in the drift layer is known as a super junction structure (hereinafter referred to as SJ structure). In the SJ structure, a non-doped layer is artificially produced by equalizing the amount of charge (amount of impurities) contained in the p-type pillar layer with that contained in the n-type pillar layer. Thus, while holding a high breakdown voltage, a current is passed through the highly doped n-type pillar layer. Hence, a low on-resistance beyond the material limit can be realized.

Thus, the SJ structure can be used to achieve a balance between on-resistance and breakdown voltage beyond the material limit. A technique for forming p-type and n-type pillar layers is disclosed in JP-A 9-266311 (Kokai) (1997), for instance. In this technique, an n-type pillar layer is previously formed by epitaxial growth, and then partly etched away to form trenches in a striped configuration. A p-type pillar layer is buried in the etched trench by epitaxial growth, and the unwanted portion is polished away.

However, a void may remain in the actual p-type pillar layer when grown. Because the position of this remaining void is indeterminate, the void may appear on the polished surface even after the unwanted portion is polished. Thus, the polished surface of the SJ structure does not become flat, which results in decreasing the yield of semiconductor devices.

SUMMARY OF THE INVENTION

According to an aspect of the invention, there is provided a method for manufacturing a semiconductor device, including: forming a first-conductivity-type semiconductor region on a semiconductor layer; forming a mask member on the first-conductivity-type semiconductor region; selectively forming an opening in the mask member; etching the first-conductivity-type semiconductor region exposed to the opening to form a trench having a larger diameter than the opening and an eaves-like mask projected above the trench and made of the mask member; and forming a second-conductivity-type semiconductor region in the trench below the eaves-like mask by epitaxial growth to form a structure section in which the first-conductivity-type semiconductor region and the second-conductivity-type semiconductor region are alternately repeated in a direction generally parallel to a major surface of the semiconductor layer.

DETAILED DESCRIPTION OF THE INVENTION

An embodiment of the invention will now be described with reference to the drawings. First, an example of the semiconductor device manufactured in this embodiment is described.

Figure 5:
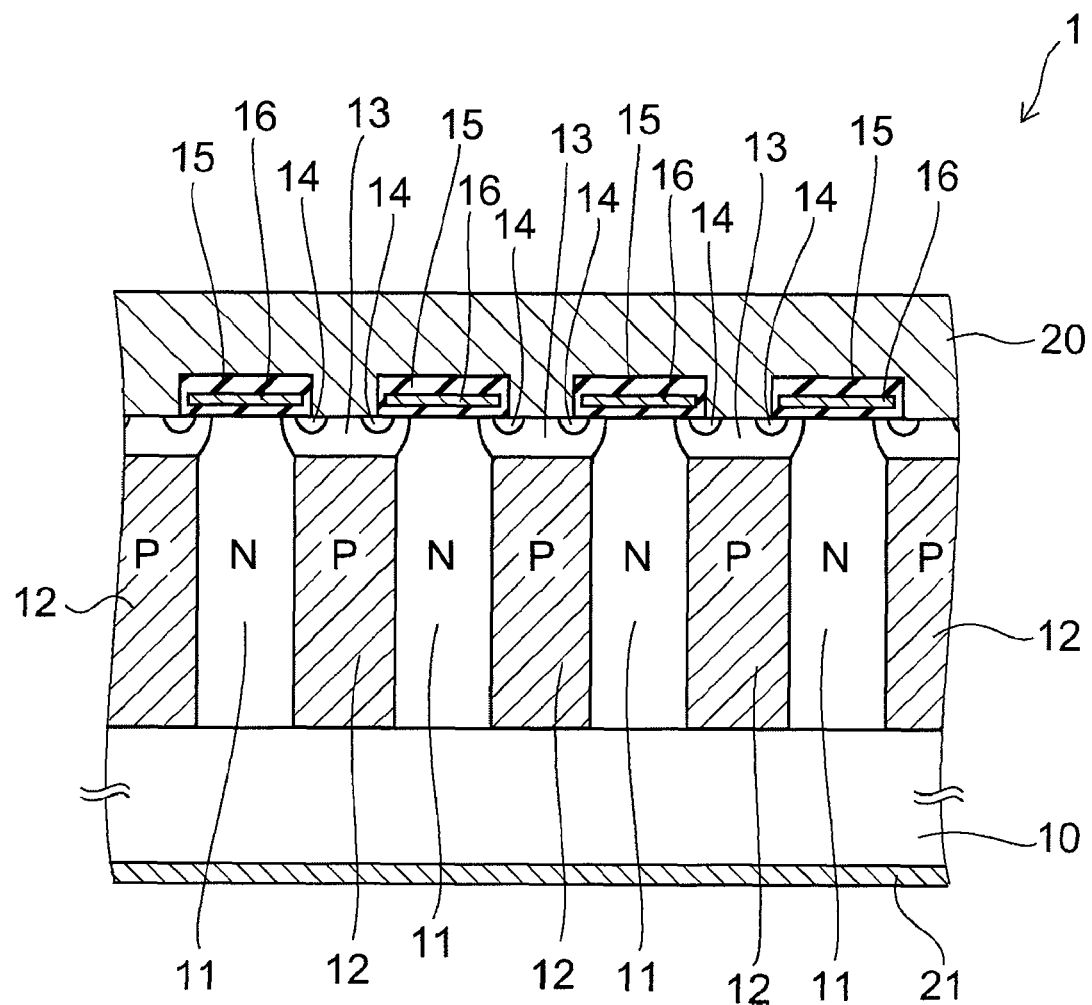
FIG. 5 is a cross-sectional schematic view of the relevant part of a semiconductor device.

FIG. 5 is a cross-sectional schematic view of the relevant part of the semiconductor device. This figure illustrates an example of the semiconductor device 1 having a SJ structure. The semiconductor device 1 is illustratively a MOSFET having a planar gate structure.

In the semiconductor device 1, on a major surface of a semiconductor layer (or semiconductor substrate) 10 made of $N^+$-type silicon (Si), a first-conductivity-type (such as N-type) semiconductor region 11 and a second-conductivity-type (such as P-type) semiconductor region 12 are periodically repeated in a direction generally parallel to the major surface of the semiconductor layer 10. Furthermore, the semiconductor region 11 and the semiconductor region 12 are in contact with the major surface of the semiconductor layer 10. That is, in the semiconductor device 1, the semiconductor region 11 and the semiconductor region 12 are adjacent to each other to form a PN junction.

Thus, the semiconductor device 1 includes a SJ structure section with the junction of the pillar-shaped semiconductor region 11 and the pillar-shaped semiconductor region 12 repeated therein. The planar pattern of the semiconductor regions 11 and the semiconductor regions 12 as viewed from above the semiconductor device 1 can be a striped or concentric pattern (not shown). These semiconductor regions 11 and semiconductor regions 12 are formed by epitaxial growth on the semiconductor layer 10 (described later).

Furthermore, in the semiconductor device 1, a base region 13 made of P-type silicon is provided in an upper portion of the semiconductor region 12. A source region 14 made of $N^+$-type silicon is selectively provided in a surface of the base region 13. A dielectric film (gate dielectric film) 15 illustratively made of silicon oxide is provided from above the semiconductor region 11 via the base region 13 to halfway through the source region 14. Furthermore, a control electrode 16 is provided in the dielectric film 15.

Furthermore, in the semiconductor device 1, a source electrode 20 in contact with the surface of the base region 13 and the source region 14 is provided on part of the source region 14 and a portion of the base region 13 located between the source regions 14. A drain electrode 21 is provided on the opposite side of the semiconductor layer 10 from the major surface.

In this semiconductor device 1, at the switch-on time, when a desired control voltage (gate voltage) is applied to the control electrode 16, an N-channel (inversion layer) is formed in the base region 13 opposed to the control electrode 16 across the dielectric film 15. Then, a current flows between the source electrode 20 and the drain electrode 21 through the source region 14, the N-channel, the semiconductor region 11, and the semiconductor layer 10.

At the switch-off time, a depletion layer extends from the PN junction between the base region 13 and the semiconductor region 11 and from the PN junction interface between the semiconductor region 11 and the semiconductor region 12. Thus, even if a high voltage is applied between the source electrode 20 and the drain electrode 21, the main current path between the source electrode 20 and the drain electrode 21 is blocked, and the semiconductor device 1 can withstand a high breakdown voltage.

While the semiconductor device 1 having the planar gate structure is illustrated in FIG. 5, a semiconductor device having a trench gate structure can also be manufactured in this embodiment.

The pillar-shaped semiconductor region 11 (or semiconductor region 12) has a width of approximately 4 μm and a depth of approximately 50 μm.

While the semiconductor region 12 is in contact with the semiconductor layer 10 in FIG. 5, the semiconductor region 12 may not be in contact with the semiconductor layer 10.

Next, a method for manufacturing the semiconductor device 1 of this embodiment is described.

FIGS. 1A to 4 are cross-sectional schematic views of the relevant part for describing the method for manufacturing the semiconductor device 1 of this embodiment. Here, FIGS. 1A to 4 primarily show an example of the method for manufacturing the SJ structure section of the semiconductor device 1.

Figure 1A:
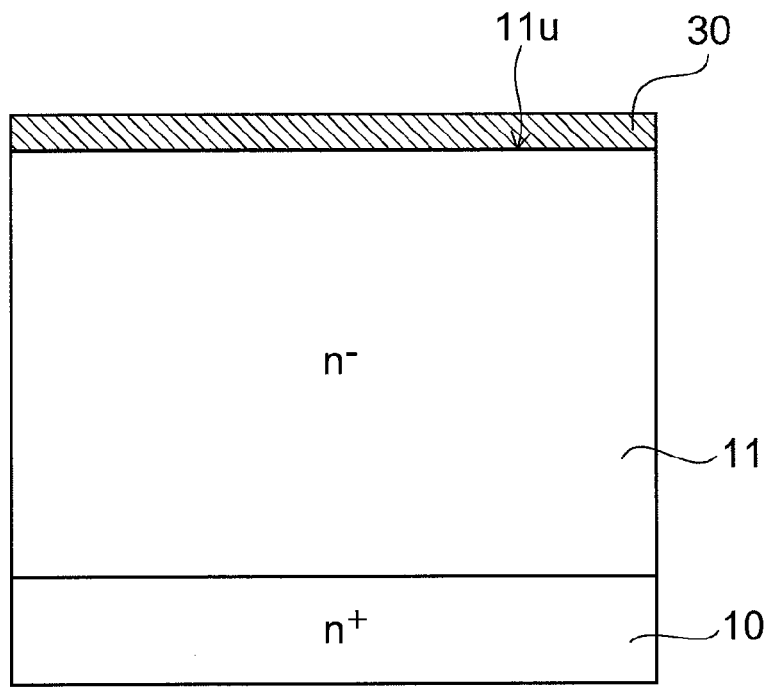
FIGS. 1A and 1B are cross-sectional schematic views of the relevant part for describing a method for manufacturing a semiconductor device 1 of the embodiment.

First, as shown in FIG. 1A, the semiconductor region 11 containing first-conductivity-type (such as N-type) impurities is formed by epitaxial growth on the major surface of the semiconductor layer 10 made of $N^+$-type silicon.

For growth of silicon being a main constituent of the semiconductor region 11, a raw material gas such as silane ($SiH_4$), dichlorosilane ($SiH_2Cl_2$), and trichlorosilane ($SiHCl_3$) is used. A growth temperature for epitaxial growth is adjusted to e.g. approximately 1000° C. The major surface of the semiconductor layer 10 underlying the semiconductor region 11 illustratively has a surface orientation of {100}. Hence, the surface orientation of an upper surface 11u of the semiconductor region 11 is also oriented to {100}.

After the semiconductor region 11 is formed, as shown in FIG. 1A, an oxide film 30 illustratively made of silicon oxide ($SiO_2$) is formed on the upper surface of the semiconductor region 11 by sputtering or CVD (chemical vapor deposition). The oxide film 30 has a thickness of e.g. approximately 0.6 μm.

Figure 1B:
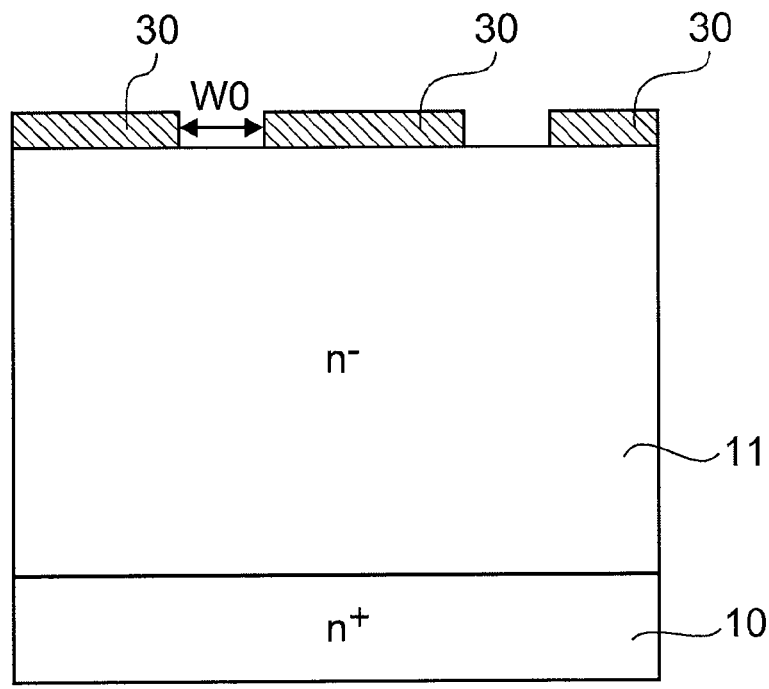

Next, as shown in FIG. 1B, the oxide film 30 is etched to form an opening portion. A width of this opening portion is denoted by "W0."

Figure 2A:
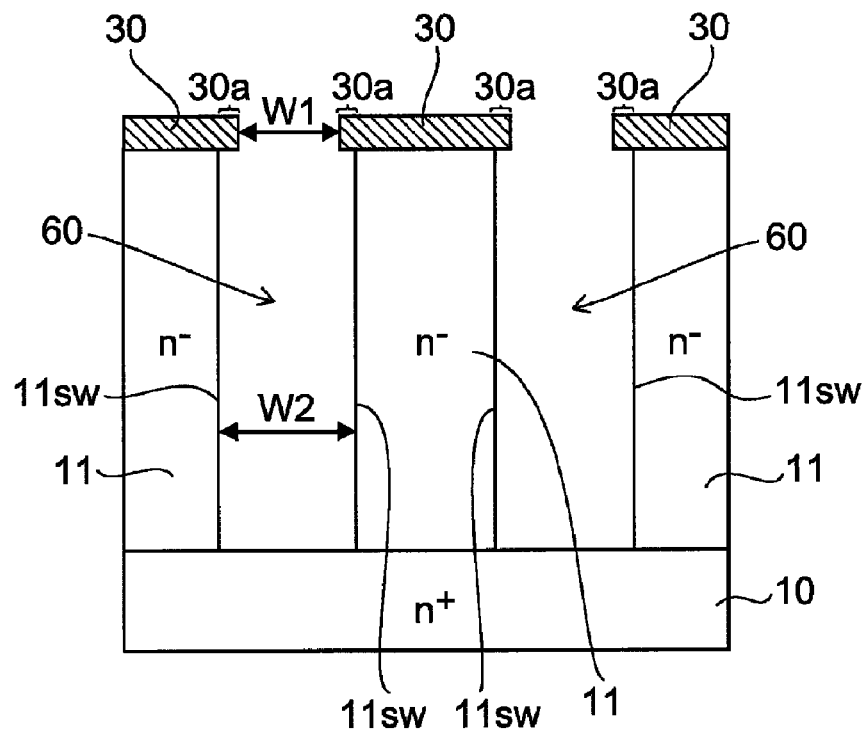
FIGS. 2A and 2B are cross-sectional schematic views of the relevant part for describing the method for manufacturing the semiconductor device 1 of the embodiment.

Subsequently, as shown in FIG. 2A, a trench 60 that is wider than the aforementioned width W0 is formed downward from the opening portion of the oxide film 30. Here, the width of the trench 60 is defined as a distance between the inner walls of the trench 60 in a direction generally parallel to the major surface of the semiconductor layer 10. This width of the trench 60 is denoted by "W2." The width W2 of the trench 60 is suitably adjusted by anisotropic etching such as RIE (reactive ion etching) or isotropic etching such as chemical etching.

Pillar-shaped semiconductor regions 11 are periodically formed on the major surface of the semiconductor layer 10 by periodically forming the trenches 60 on the major surface of the semiconductor layer 10. Here, a surface orientation of a side surface (inner sidewall) 11sw of the pillar-shaped semiconductor region 11 is perpendicular to the major surface of the semiconductor layer 10, and hence is oriented to {110}. Furthermore, after the trench 60 is formed, a surface of the semiconductor layer 10 is exposed to a bottom of the trench 60.

Then, the aforementioned opening width W0 is further processed by isotropic etching such as chemical etching, and the oxide film 30 with an opening width "W1" is eventually formed on the semiconductor region 11.

Here, in this embodiment, the opening width W1 of the oxide film 30 is smaller than the width W2 of the trench 60 (W1<W2). More specifically, the end of the oxide film 30 is projected to the region of the trench 60 to provide an eaves portion (eaves-like mask) 30a in the oxide film 30. Thus, the eaves portion 30a projected into the trench 60 has a length of (W2−W1)/2. Accordingly, the upper surface 11u of the semiconductor region 11 is completely covered with the oxide film 30.

Thus, the oxide film 30 includes the eaves portion 30a partly occluding the opening of the trench 60. Hence, only the surface of the semiconductor layer 10 having a surface orientation of {100} and the surface of the semiconductor region 11 having a surface orientation of {110} are exposed in the trench 60.

Figure 2B:
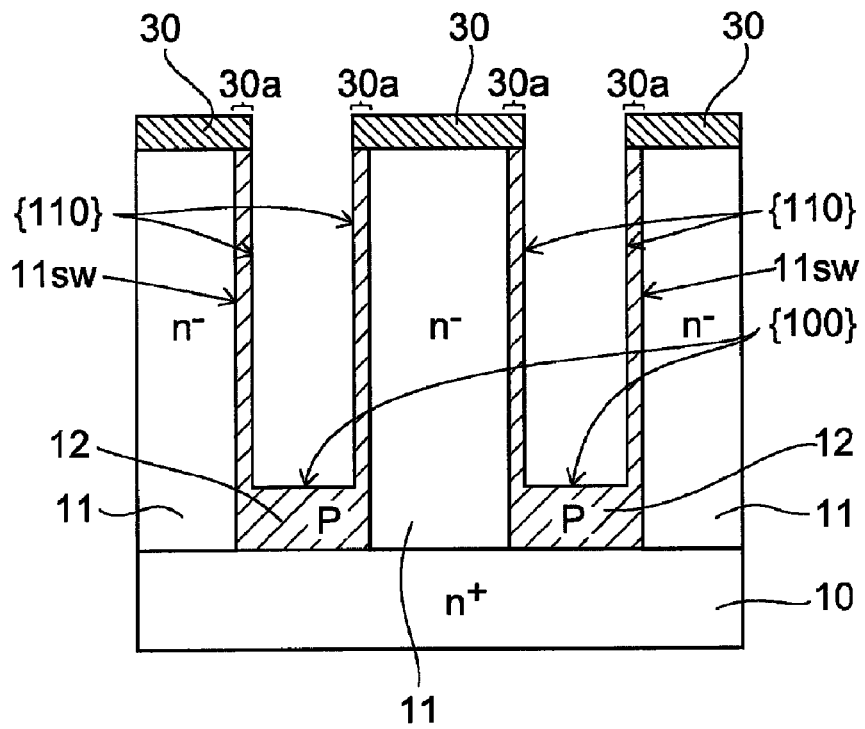

Next, in order to bury the semiconductor region 12 containing second-conductivity-type (such as P-type) impurities, epitaxial growth of the semiconductor region 12 is started in the trench 60. The raw material gas for forming a main constituent of the semiconductor region 12 and the growth condition are described above. FIG. 2B shows the state.

Here, the semiconductor layer 10 exposed in the trench 60 has the surface orientation of {100}, and the side surface 11sw of the semiconductor region 11 has the surface orientation of {110}. Hence, in epitaxial growth of the semiconductor region 12, it is grown with the {100} surface and the {110} surface exposed as the growth surface of the semiconductor region 12.

Then, as shown in FIG. 2B, epitaxial growth of the semiconductor region 12 is continued, and the {110} surface of the semiconductor region 12 reaches the tip of the eaves portion 30a.

Figure 3A:
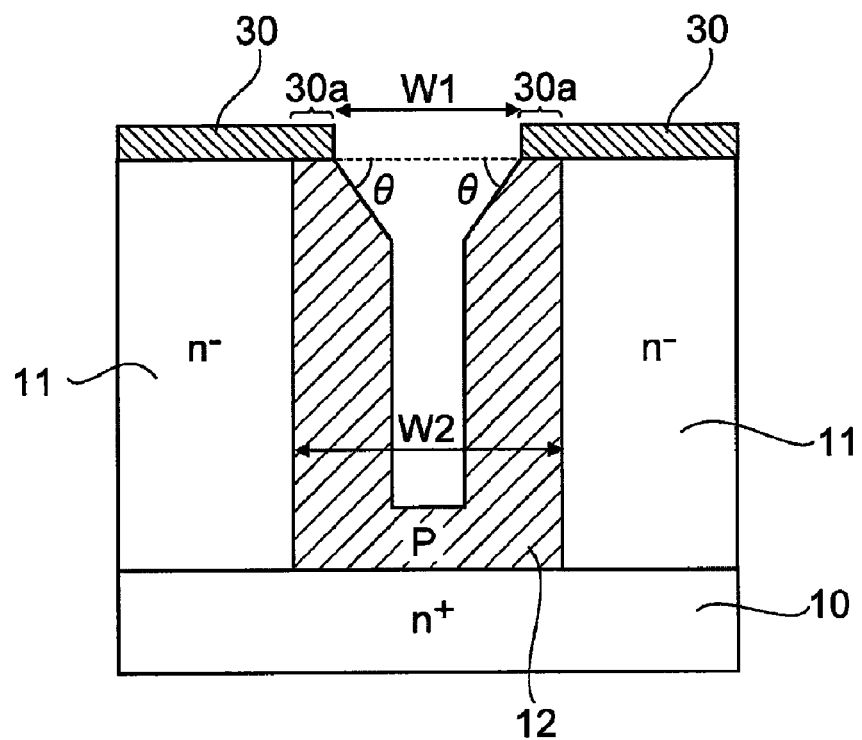
FIGS. 3A and 3B are cross-sectional schematic views of the relevant part for describing the method for manufacturing the semiconductor device 1 of the embodiment.

Subsequently, epitaxial growth of the semiconductor region 12 is continued, and the {110} surface of the semiconductor region 12 surpasses the tip of the eaves portion 30a. Then, as shown in FIG. 3A, the semiconductor region 12 exposes a {111} surface in addition to the {100} surface and the {110} surface. At this time, of the growth surfaces of the semiconductor region 12, the growth surface of the semiconductor region 12 parallel to the sidewall of the trench 60 (second growth surface) is grown more rapidly than the growth surface of the semiconductor region 12 non-parallel to the sidewall of the trench 60 (first growth surface).

Here, the growth rate of silicon in epitaxial growth varies with the surface orientation of silicon in the following order: {100} surface>{110} surface>>{111} surface.

That is, at the stage where the {110} surface of the semiconductor region 12 has surpassed the tip of the eaves portion 30a, if the semiconductor region 12 is epitaxially grown into the trench 60, then, while the {100} surface of the semiconductor region 12 is grown most rapidly, the {110} surface of the semiconductor region 12 is grown more rapidly than the {111} surface of the semiconductor region 12.

Hence, the {110} surface of the semiconductor region 12 grown from both sides of the inner wall of the trench 60 is grown earlier than the {111} surface of the semiconductor region 12. Then, ultimately, the {110} surfaces of the semiconductor region 12 grown from both sides of the inner wall of the trench 60 are joined to each other.

Figure 3B:
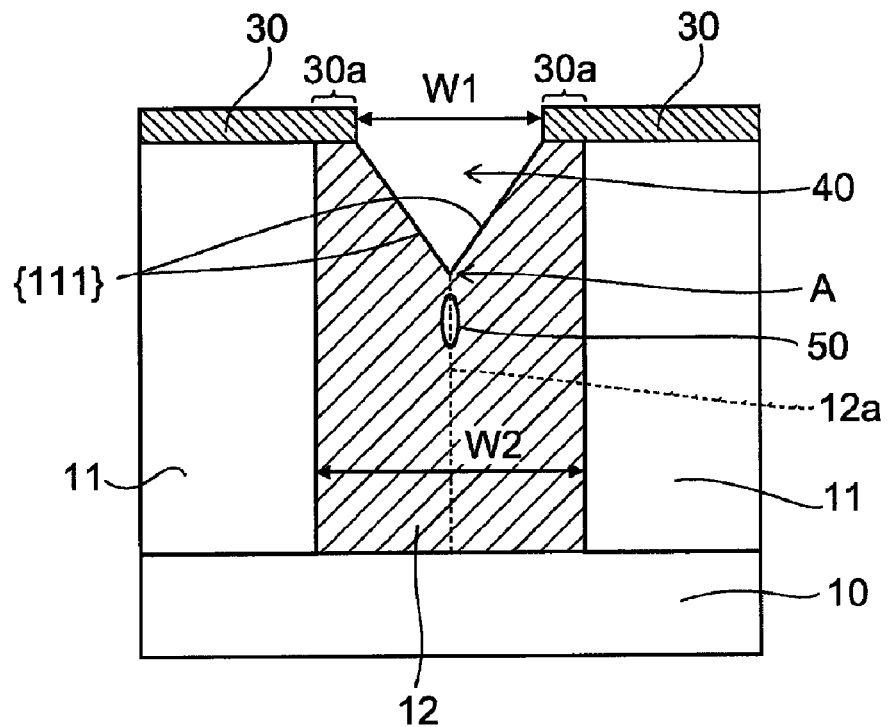

FIG. 3B shows the state occurring immediately after the {110} surfaces of the semiconductor region 12 are joined to each other. As shown in FIG. 3B, the {110} surfaces of the semiconductor region 12 are joined to each other, and the trench 60 is filled with the semiconductor region 12.

However, immediately after the {110} surfaces are joined to each other, a V-shaped cross section 40 with the slope formed from the {111} surface occurs at the center of the semiconductor region 12.

Furthermore, when the {110} surfaces are joined to each other, a void 50 may occur somewhere at a junction surface 12a of the {110} surfaces.

Here, because the {110} surfaces are grown earlier than the {111} surface and joined to each other, the void 50 is formed necessarily below the V-shaped cross section 40.

That is, when "A" denotes an apex of the V-shaped cross section 40, the void 50 is definitely contained in the semiconductor region 12 below (toward the semiconductor layer 10 from) the apex A. This result is also confirmed by a cross-sectional SEM image.

Figure 4:
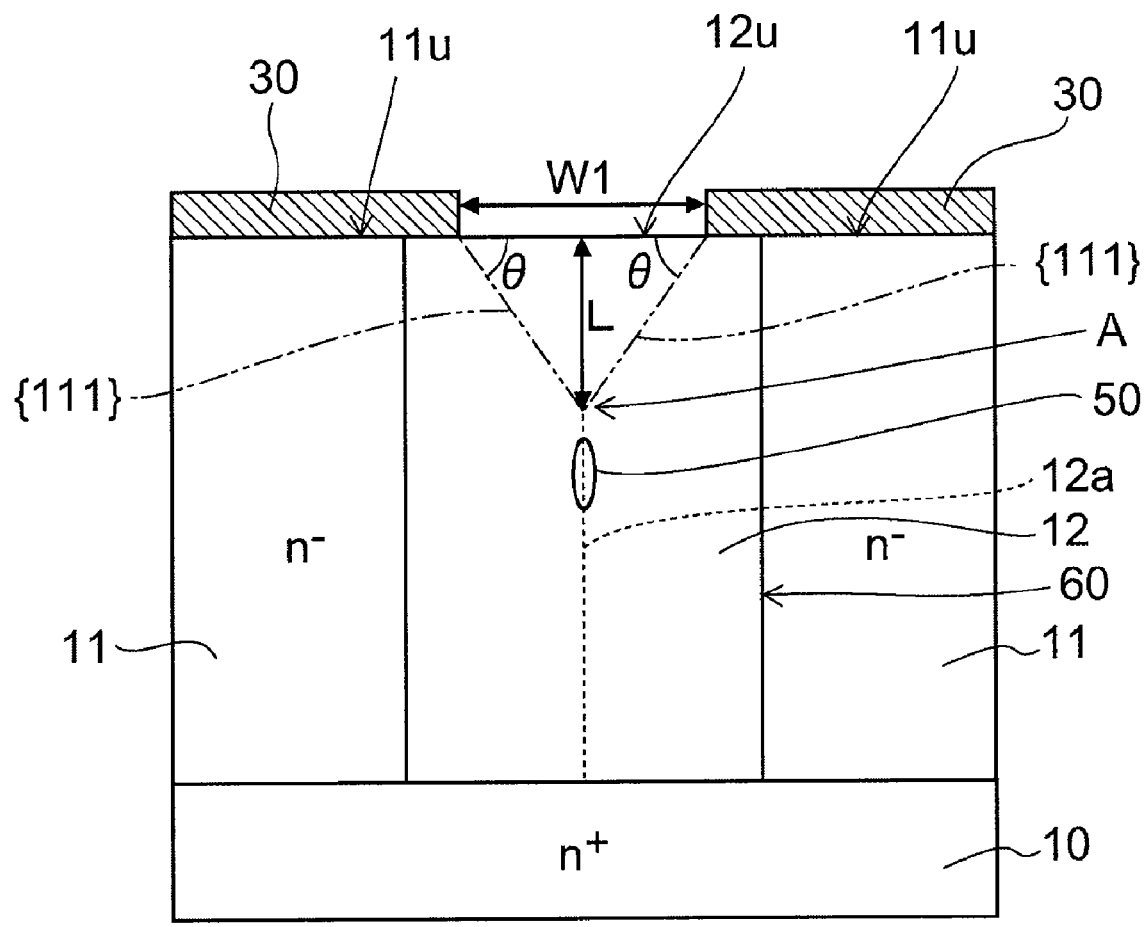
FIG. 4 is a cross-sectional schematic view of the relevant part for describing the method for manufacturing the semiconductor device 1 of the embodiment.

Subsequently, epitaxial growth of the semiconductor region 12 is continued. Then, the {111} surface of the V-shaped cross section 40 grows, and the trench 60 is entirely filled with the semiconductor region 12. FIG. 4 shows this state.

As shown in FIG. 4, the trench 60 is filled with the semiconductor region 12, and a periodic arrangement of the semiconductor region 11 and the semiconductor region 12 is formed.

Here, the angle of slope of the {111} surface with respect to the upper surface 12u of the semiconductor region 12 (or the upper surface 11u of the semiconductor region 11, or the lower surface of the oxide film 30) is denoted by "θ." Then, the distance L from the apex A to the upper surface 12u of the semiconductor region 12 (or the upper surface 11u of the semiconductor region 11) is given by L=(W1/2)×tan θ (θ=54.7°).

That is, L is adjusted to a specific value by controlling W1.

Next, the surface of the semiconductor region 11 and the semiconductor region 12 is polished to a depth less than the distance (L<(W1/2)×tan θ). Then, the void 50 is not exposed to the polished surface, and a SJ structure having a flat surface is formed.

Here, even if epitaxial growth is continued until the upper surface 12u of the semiconductor region 12 becomes higher than the upper surface 11u of the semiconductor region 11, there is no problem because the distance L, which gives the amount of polishing, is determined on the basis of the above equation. The elevated portion of the semiconductor region 12 can also be polished away.

The method for polishing the semiconductor region 11 and the semiconductor region 12 is illustratively based on CMP (chemical mechanical polishing).

By this method, the SJ structure section of the semiconductor device 1 is manufactured.

Subsequently, as shown in FIG. 5, a MIS (metal insulator semiconductor) structure including a base region 13, source region 14, dielectric film 15, control electrode 16, and the like is formed on the surface of the SJ structure section. Furthermore, a source electrode 20 and a drain electrode 21 are also formed.

More specifically, a second-conductivity-type base region 13 is formed in the surface of the semiconductor region 12 of the structure section composed of the semiconductor regions 11 and 12, and a first-conductivity-type source region 14 is selectively formed in the surface of the second-conductivity-type base region 13. Subsequently, a dielectric film 15 is formed so as to extend from the surface of the source region 14 via the surface of the adjacent base region 13 to the surface of the semiconductor region 11, and a control electrode 16 is formed on the dielectric film 15. Furthermore, a source electrode 20 connected to the source region 14 is formed. A drain electrode 21 is formed on the backside of the semiconductor layer.

Here, because the SJ structure section is formed flat, no unevenness occurs in the base region 13 by subsequent processes. Furthermore, no void 50 is exposed from the aforementioned polished surface. Hence, during the process for manufacturing the semiconductor device 1, no dust and the like enter the void 50, or no dust and the like occur due to the void 50.

In contrast, the phenomenon described below unfortunately occurs in a process (comparative example) for manufacturing a SJ structure section without providing the aforementioned eaves portion of the oxide film.

First, as described above, pillar-shaped semiconductor regions 11 and trenches 60 between the semiconductor regions 11 are formed on the major surface of a semiconductor layer 10. Because the trench 60 is formed, the surface of the semiconductor layer 10 is exposed to the bottom of the trench 60.

In this comparative example, the aforementioned eaves portion is not provided in the oxide film. Hence, the opening width W1 of the oxide film 30 exceeds the width W2 of the trench 60 (W1>W2).

If epitaxial growth of the semiconductor region 12 in the trench 60 is performed in this state, the semiconductor region 12 is grown also from the upper edge of the semiconductor region 11 because the {100} surface of the semiconductor region 11 is exposed near the end of the oxide film 30.

Here, the {100} surface has a higher growth rate than the {110} surface and the {111} surface, and the raw material gas is supplied more easily to the upper portion of the trench 60 than to the bottom of the trench 60. Hence, the semiconductor region 12 is rapidly grown from the upper edge of the semiconductor region 11, and the trench 60 is filled up with the semiconductor region 12.

Because the semiconductor region 12 is rapidly grown from the upper edge of the semiconductor region 11, the apex A of the V-shaped cross section becomes higher than the apex A shown in FIG. 3B. Furthermore, because the semiconductor region 12 is rapidly grown from the upper edge of the semiconductor region 11, the apex A may accidentally vary in position. Thus, the void 50 may be located in an upper portion, middle portion, or lower portion of the semiconductor region 12.

Hence, the position of the apex A varies in each device, and there is no guarantee that the void 50 is necessarily located below a certain depth from the surface of the semiconductor region 12.

In contrast, in the method for manufacturing a semiconductor device according to this embodiment, the void 50 can be confined definitely below the apex A.

Thus, according to this embodiment, when the SJ structure section of the semiconductor device 1 is formed by epitaxial growth, the formation position of the void 50 is controlled by the opening width W1 of the oxide film 30.

Hence, in the process for polishing the SJ structure section, the void 50 is not exposed from the polished surface, and the polished surface definitely becomes flat. That is, the yield of the semiconductor device is increased according to this embodiment.

In the example described in this embodiment, the void 50 is confined definitely below the apex A using the difference in growth rate between the {110} surface and the {111} surface. However, with regard to the growth surface, the method may be based on the difference in growth rate between the {110} surface and the {010} surface. In this case, the {010} surface has a higher growth rate than the {110} surface and constitutes the sidewall of the trench 60, and the {110} surface constitutes a V-shaped cross section.

Furthermore, the {110} surface and the {010} surface of the sidewall of the trench 60 may be sloped several degrees from the current angle. For instance, this configuration may occur in the case of using a so-called off-substrate in which the major surface of the substrate (semiconductor wafer) is oriented several degrees off from the {100} surface. This embodiment also encompasses a method for growing a semiconductor layer on the aforementioned surface sloped by several degrees.

Furthermore, in processing the trench 60, the sidewall of the trench 60 may be tapered depending on the etching condition. This case is also encompassed in this embodiment.

In the example described in this embodiment, the substrate material is silicon. However, the invention is not limited to this example. For instance, the substrate material can also be based on other semiconductor materials such as gallium arsenide (GaAs) materials, silicon carbide (SiC) materials, or gallium nitride (GaN) materials, or combinations thereof.

In this embodiment, the trench is illustratively filled with the P-type semiconductor region 12. However, this embodiment is also applicable to a method for forming a trench 60 in the semiconductor region 12 and epitaxially growing an N-type semiconductor region 11 in the trench.

Furthermore, instead of the oxide film 30, a silicon nitride film (SiN) can be used.

The invention claimed is:

1. A method for manufacturing a semiconductor device, comprising:
    forming a first-conductivity-type semiconductor region on a semiconductor layer;
    forming a mask member on the first-conductivity-type semiconductor region;
    selectively forming an opening in the mask member;
    etching the first-conductivity-type semiconductor region exposed to the opening to form a trench having a larger diameter than the opening and an eaves-like mask projected above the trench and made of the mask member;
    forming a second-conductivity-type semiconductor region in the trench below the eaves-like mask by epitaxial growth to form a structure section in which the first-conductivity-type semiconductor region and the second-conductivity-type semiconductor region are alternately repeated in a direction generally parallel to a major surface of the semiconductor layer; and
    removing a surface portion of the structure section to a depth L satisfying
    $L < (W1/2) \times \tan \Theta$,
    where W1 is a diameter of the opening having a smaller diameter than the trench, and $\Theta$ is an angle between the major surface of the semiconductor layer and a first growth surface of the second-conductivity-type semiconductor region which is non-parallel to a sidewall of the trench.

2. The method according to claim 1, further comprising:
    forming a second-conductivity-type base region in a surface of the second-conductivity-type semiconductor region of the structure section;
    selectively forming a first-conductivity-type source region in a surface of the second-conductivity-type base region;
    forming a gate dielectric film extending from a surface of the source region to a surface of the first-conductivity-type semiconductor region via the surface of the adjacent base region;
    forming a control electrode on the gate dielectric film;
    forming a source electrode connected to the source region; and
    forming a drain electrode connected to a backside of the semiconductor layer.

3. The method according to claim 1, wherein the second-conductivity-type semiconductor region is formed in the trench while providing a difference in growth rate between the first growth surface non-parallel to the sidewall of a trench and a second growth surface parallel to the sidewall of the trench.

4. The method according to claim 3, wherein the second-conductivity-type semiconductor region is formed in the trench while growing the second growth surface more rapidly than the first growth surface.

5. The method of claim 3, wherein the major surface of the semiconductor layer has a {100} surface orientation, and the first growth surface non-parallel to the sidewall of the trench of the second-conductivity-type semiconductor region is a {111} surface or {110} surface of the second-conductivity-type semiconductor region.

6. The method according to claim 3, wherein the major surface of the semiconductor layer has a {100} surface orientation, and the second growth surface parallel to the sidewall of the trench of the second-conductivity-type semiconductor region is a {110} surface or {010} surface of the second-conductivity-type semiconductor region.

7. The method according to claim 3, wherein the second growth surface is a {110} surface of the second-conductivity-type semiconductor region when the first growth surface is the {111} surface of the second-conductivity-type semiconductor region.

8. The method according to claim 3, wherein the second growth surface is a {010} surface of the second-conductivity-type semiconductor region when the first growth surface is the {110} surface of the second-conductivity-type semiconductor region.

9. The method according to claim 1, wherein the surface portion of the structure section is removed by polishing.

10. The method according to claim 1, wherein the second-conductivity-type semiconductor region includes a void at a position deeper than the depth L.

11. The method according to claim 10, wherein the second-conductivity-type semiconductor regions grown from inner walls of the trench are joined in the trench and the void is contained in the second-conductivity-type semiconductor region at the position deeper than the depth L.

12. The method according to claim 11, wherein a V-shaped cross section is formed on the second-conductivity-type semiconductor region immediately after the second-conductivity-type semiconductor regions are joined.

13. The method according to claim 1, wherein the mask member is made of an oxide film or a nitride film.

14. The method according to claim 1, wherein a sidewall of the trench is not perpendicular to a surface orientation of the major surface of the semiconductor layer.

* * * * *